United States Patent
Peters

(10) Patent No.: US 11,245,007 B2
(45) Date of Patent: Feb. 8, 2022

(54) WIDE-BANDGAP SEMICONDUCTOR DEVICE INCLUDING GATE FINGERS BETWEEN BOND PADS

(71) Applicant: Infineon Technologies AG, Neubiberg (DE)

(72) Inventor: Dethard Peters, Hoechstadt (DE)

(73) Assignee: Infineon Technologies AG, Neubiberg (DE)

(*) Notice: Subject to any disclaimer, the term of this patent is extended or adjusted under 35 U.S.C. 154(b) by 86 days.

(21) Appl. No.: 15/979,218

(22) Filed: May 14, 2018

(65) Prior Publication Data
US 2018/0331181 A1 Nov. 15, 2018

(30) Foreign Application Priority Data

May 15, 2017 (DE) .......................... 102017110536.0

(51) Int. Cl.
H01L 29/06 (2006.01)
H01L 29/10 (2006.01)
(Continued)

(52) U.S. Cl.
CPC .......... *H01L 29/0696* (2013.01); *H01L 24/42* (2013.01); *H01L 29/0615* (2013.01); *H01L 29/0623* (2013.01); *H01L 29/1095* (2013.01); *H01L 29/1608* (2013.01); *H01L 29/417* (2013.01); *H01L 29/4238* (2013.01); *H01L 29/42372* (2013.01); *H01L 29/45* (2013.01);
(Continued)

(58) Field of Classification Search
CPC ............. H01L 29/0696; H01L 29/1608; H01L 29/42372; H01L 29/4933; H01L 29/7395; H01L 29/7827
See application file for complete search history.

(56) References Cited

U.S. PATENT DOCUMENTS

| | | | |
|---|---|---|---|
| 5,883,412 A | 3/1999 | Ferla et al. | |
| 9,142,662 B2* | 9/2015 | Ryu | .................... H01L 29/0696 |

(Continued)

FOREIGN PATENT DOCUMENTS

| | | |
|---|---|---|
| CN | 203521422 U | 4/2014 |
| CN | 103918079 A | 7/2014 |

(Continued)

*Primary Examiner* — Zandra V Smith
*Assistant Examiner* — Andre C Stevenson
(74) *Attorney, Agent, or Firm* — Murphy, Bilak & Homiller, PLLC

(57) ABSTRACT

A semiconductor device includes a semiconductor body of a wide-bandgap semiconductor material. A plurality of first bond areas is connected to a first load terminal of the semiconductor device. First gate fingers are arranged between the first bond areas. The first gate fingers extend in a first lateral direction and branch off from at least one of a first gate line portion and a second gate line portion. Second gate fingers extend in the first lateral direction. A first length of any of the first gate fingers along the first lateral direction is greater than a second length of any of the second gate fingers along the first lateral direction. A sum of the first length and the second length is equal to or greater than a lateral distance between the first gate line portion and the second gate line portion along the first lateral direction.

28 Claims, 5 Drawing Sheets

(51) Int. Cl.
*H01L 29/423* (2006.01)
*H01L 29/45* (2006.01)
*H01L 23/00* (2006.01)
*H01L 29/417* (2006.01)
*H01L 29/16* (2006.01)
*H01L 29/49* (2006.01)
*H01L 29/739* (2006.01)
*H01L 29/78* (2006.01)

(52) U.S. Cl.
CPC ...... *H01L 29/4933* (2013.01); *H01L 29/7395* (2013.01); *H01L 29/7827* (2013.01); *H01L 2224/0603* (2013.01); *H01L 2224/49113* (2013.01); *H01L 2224/49175* (2013.01); *H01L 2924/13055* (2013.01); *H01L 2924/19107* (2013.01)

(56) References Cited

U.S. PATENT DOCUMENTS

| | | | |
|---|---|---|---|
| 2011/0024834 A1* | 2/2011 | Hull | H01L 29/42376 257/335 |
| 2011/0031535 A1* | 2/2011 | Iwamatsu | H01L 27/0207 257/203 |
| 2013/0146886 A1* | 6/2013 | Disney | H01L 29/402 257/76 |
| 2015/0279781 A1* | 10/2015 | Kaibara | H01L 24/05 257/775 |
| 2017/0213811 A1* | 7/2017 | Das | H01L 24/49 |
| 2017/0301766 A1* | 10/2017 | Ichijoh | H01L 29/42316 |
| 2018/0076295 A1* | 3/2018 | Norton | H01L 29/41758 |

FOREIGN PATENT DOCUMENTS

| | | |
|---|---|---|
| DE | 69434268 T2 | 1/2006 |
| DE | 102011003213 A1 | 7/2012 |
| JP | 2000101076 A | 4/2000 |
| JP | 2003017697 A | 1/2003 |
| JP | 2003101039 A | 4/2003 |
| JP | 2007234850 A | 9/2007 |
| JP | 2009141007 A | 6/2009 |
| JP | 2012146998 A | 8/2012 |
| JP | 2014531752 A | 11/2014 |
| WO | 2011014290 A1 | 2/2011 |

* cited by examiner

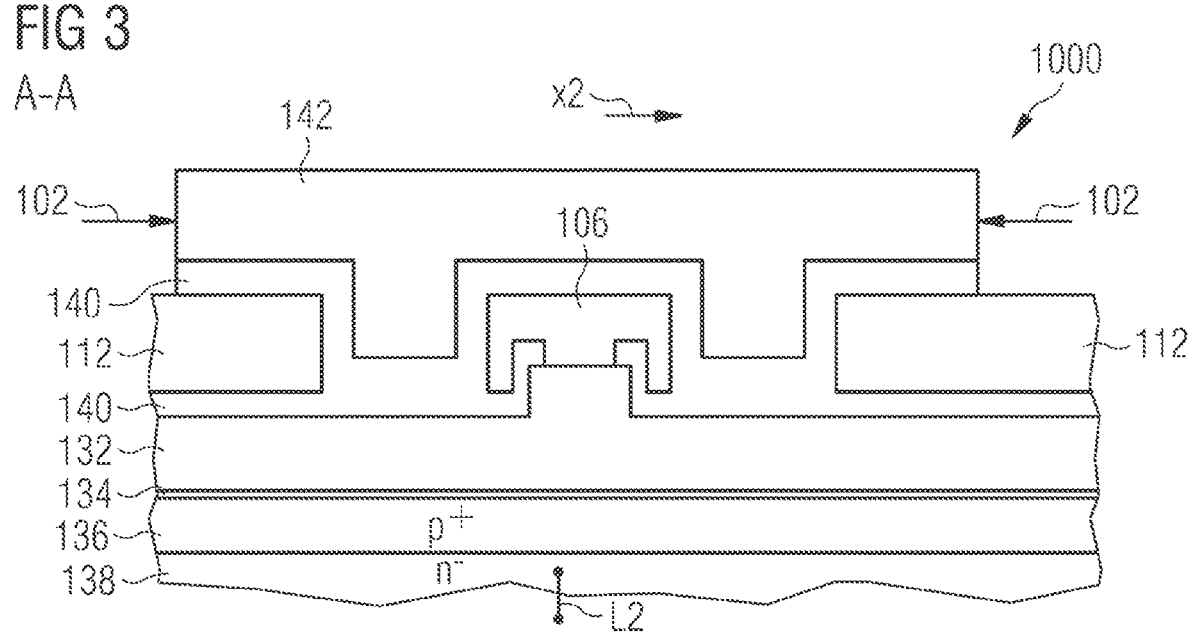
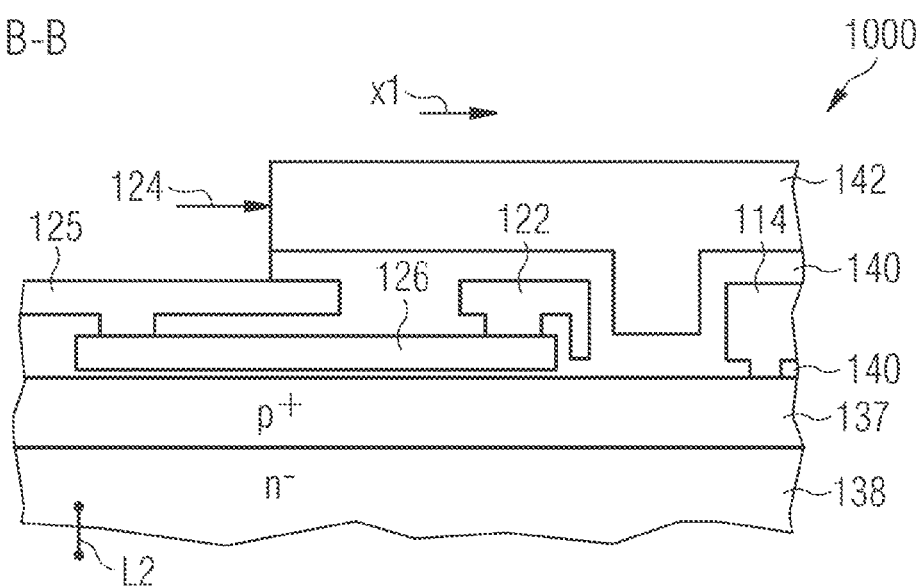

C-C

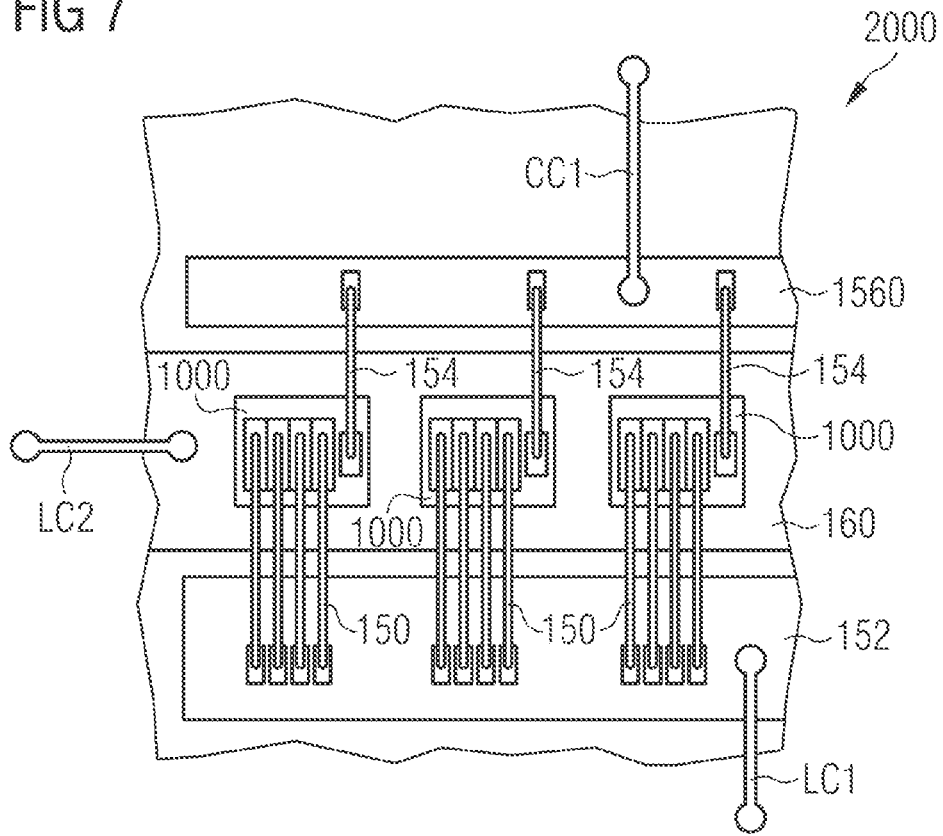

WIDE-BANDGAP SEMICONDUCTOR DEVICE INCLUDING GATE FINGERS BETWEEN BOND PADS

BACKGROUND

Wide-bandgap semiconductor devices are based on a semiconductor material with a bandgap of at least 2 eV or at least 3 eV and allow for lower on-state resistance and higher current densities compared to conventional silicon-based semiconductor devices. When switching high current densities at high frequencies in wide-bandgap semiconductor devices such as, for example, field effect transistors (FETs) or insulated gate bipolar transistors (IGBTs), a homogeneous current distribution across an active area of a transistor cell array is desirable for avoiding excessive stress that may be caused by an inhomogeneous current distribution and that may deteriorate the reliability of the semiconductor device.

It is desirable to increase uniformity of a load current distribution across an active area of wide-bandgap semiconductor devices.

SUMMARY

The present disclosure relates to a semiconductor device comprising a semiconductor body of a wide-bandgap semiconductor material. A plurality of first bond areas is electrically connected to a first load terminal of the semiconductor device. First gate fingers are arranged between the first bond areas. The first gate fingers extend in a first lateral direction and branch off from at least one of a first gate line portion and a second gate line portion. Second gate fingers extend in the first lateral direction. A first length of any of the first gate fingers along the first lateral direction is greater than a second length of any of the second gate fingers along the first lateral direction. A sum of the first length and the second length is equal to or greater than a lateral distance between the first gate line portion and the second gate line portion along the first lateral direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments and together with the description serve to explain principles of the invention. Other embodiments of the invention and intended advantages will be readily appreciated as they become better understood by reference to the following detailed description.

FIG. 3 is one example of a schematic cross-sectional view along line A-A of FIG. 2 illustrating a stripe-shaped trench gate structure.

FIG. 4 is one example of a schematic cross-sectional view along line B-B of FIG. 2 illustrating an electric connection between a gate line and a gate bond area.

FIG. 7 is one example of a schematic plan view for illustrating a semiconductor module including wide-bandgap semiconductor devices.

DETAILED DESCRIPTION

Figure 1A:
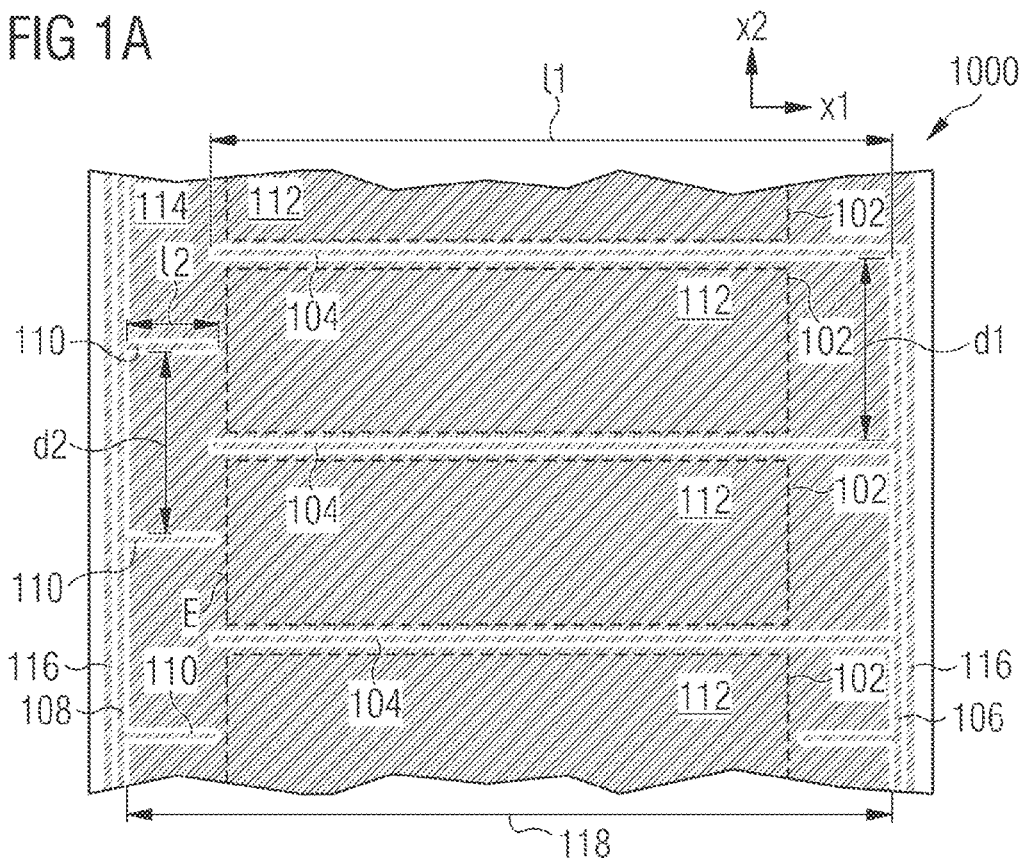
FIGS. 1A, 1B and 2 are schematic plan views for illustrating wide-bandgap semiconductor devices including gate fingers between bond pads.

In the following detailed description, reference is made to the accompanying drawings, which form a part hereof, and in which are shown by way of illustrations specific embodiments in which the disclosure may be practiced. It is to be understood that other embodiments may be utilized, and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

Figure 1B:
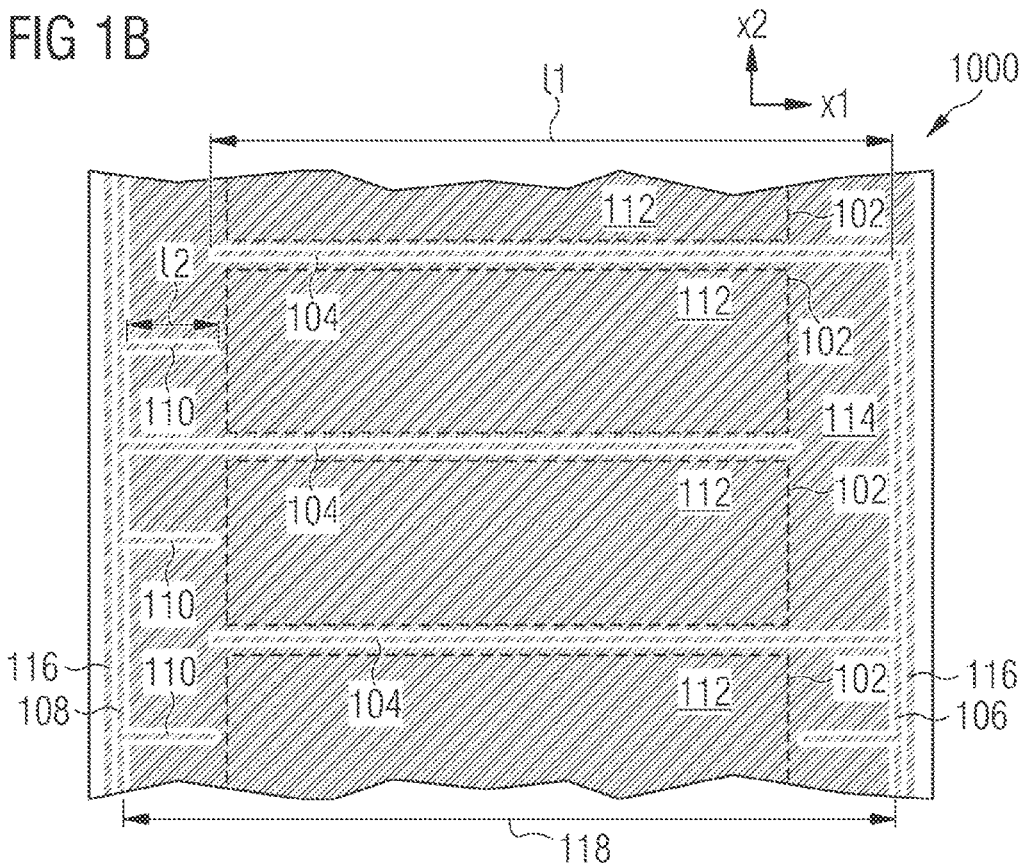

FIGS. 1A and 1B are schematic plan views for illustrating wide-bandgap semiconductor devices 1000 including gate fingers between bond pads.

The semiconductor devices 1000 comprise a semiconductor body of a wide-bandgap semiconductor material. A plurality of first bond areas 102 is electrically connected to a first load terminal of the semiconductor device, for example a source terminal of an FET or an emitter terminal of an IGBT. In some embodiments, the first bond areas 102 constitute part of a contact metallization of the first load terminal and may each be defined by an opening in a passivation layer, for example. First gate fingers 104 are arranged between the first bond areas 102. The first gate fingers 104 extend in a first lateral direction x1 and branch off from at least one of a first gate line portion 106 and a second gate line portion 108. Second gate fingers 110 extend in the first lateral direction x1. A first length l1 of any of the first gate fingers 104 along the first lateral direction x1 is greater than a second length l2 of any of the second gate fingers 110 along the first lateral direction x1. A sum of the first length l1 and the second length l2 is equal to or greater than a lateral distance d between the first gate line portion 106 and the second gate line portion 108 along the first lateral direction x1. The first and second gate line portions may be part of a gate line or a so-called gate runner, and the gate line or the gate runner may be electrically coupled to a gate bond area, for example.

As illustrated in FIGS. 1A and 1B, each of the first gate fingers 104 may extend parallel to a longitudinal direction of the first bond areas 102, the longitudinal direction being a direction of maximum extension of the first bond areas 102 along any lateral direction. In the embodiments illustrated in FIGS. 1A and 1B, the longitudinal direction coincides with the first lateral direction x1. In some embodiments, a length of the first bond areas 102 along the longitudinal direction may range between 0.2 mm and 10 mm. In one or more embodiments, the first gate fingers 104 may extend from the first gate line portion 106 or from the second gate line portion 108 along the longitudinal direction of the first bond areas 102 through a gap between neighboring two of the first bond areas 102 up to or beyond a lateral end E of the first bond areas 102.

In the embodiments illustrated in FIGS. 1A and 1B, the first gate fingers 104 and the first bond areas 102 are alternately arranged along a second lateral direction x2. The second lateral direction x2 may be perpendicular to the first lateral direction x1. In the embodiment illustrated in FIG. 1A, the first gate fingers 104 branch off from the first gate line portion 106. In the embodiment illustrated in FIG. 1B, the first gate fingers 104 branch off from the first gate line portion 106 and from the second gate line portion 108.

In some embodiments, a lateral distance between neighboring two of the first gate fingers 104, for example a lateral distance d1 as illustrated in FIG. 1A may be constant among the first gate fingers 104.

Similar to the first gate fingers 104, also the second gate fingers 110 may branch off from the first gate line portion 106 and/or the second gate line portion 108. In some embodiments, a lateral distance between neighboring two of the second gate fingers 110, for example a lateral distance d2 as illustrated in FIG. 1A, may be equal among a plurality or all of the second gate fingers 110. In one or more embodiments, the first distance d1 may correspond to the second distance d2. This may be beneficial with respect to similar or equal gate signal transit times of a gate signal propagating from the first bond areas 102 to gate electrodes of the wide-bandgap semiconductor devices 1000. Since a signal delay caused by a resistance of the gate fingers and the gate line between a gate pad and the gate electrode is typically negligible compared with a resistance of the gate electrode between the gate finger and a position at the gate electrode that has a maximum distance to the gate finger, setting d1 equal to or similar to d2 allows for setting a maximum distance between a gate finger and any position along a gate electrode to half of d1 in case the gate electrodes extend along the second direction x2, regardless of whether the gate electrodes are driven by the first gate fingers 104 or by the second gate fingers 110.

In some embodiments, in addition to the first and second gate fingers 104, 110, further gate fingers may branch off from the first or second gate line portion 106, 108 for example for electrically connecting gate electrodes in those parts of a transistor cell area that are located at or around corner regions and cannot be made part of a regular gate finger contact array.

In one or more embodiments, the first bond areas 102 include first bond area sections 112 of a continuous metallization area, the first bond area sections 112 being merged by first interconnection sections 114 of the continuous metallization area. The continuous metallization area may be formed, for example, by lithographically patterning of one or more metallization layers that may be formed in one or more metallization levels. In some embodiments, each of the first gate fingers 104 is offset with respect to each of the second gate fingers 110 along the second lateral direction x2, thereby providing a direction contact between the first bond area sections 112 and the first interconnection sections 114.

In the embodiment illustrated in FIG. 1A, the length l1 is constant among the first gate fingers 104. Likewise, the length l2 is constant among the second gate fingers 110 illustrated in FIG. 1A. In one or more other embodiments, the lengths of some or all of the first gate fingers 104 may differ from one another, and the lengths of some or all of the first gate fingers 104 may also differ from one another provided that a first length l1 of any of the first gate fingers 104 is greater than a second length l2 of any of the second gate fingers 110.

In one or more embodiments, the first length l1 is between 0.2 mm and 10 mm, and the first lateral distance d1 between the first gate fingers is between 0.1 mm and 1.5 mm.

In one or more embodiments, the first length l1 is larger than the first lateral distance d1 between neighboring two of the first gate fingers 104, and the second length l2 is smaller than the second lateral distance d2 between the second gate fingers 110. In some embodiments, for example the embodiment illustrated in FIG. 1A, the second length l2 is smaller than 60% of the second lateral distance d2 between the second gate fingers 110. This may allow the first interconnection sections 114 for providing a low-ohmic electric connection from the first bond area sections 112 to first load regions of the wide-bandgap semiconductor devices 1000, for example source regions that are located below the first interconnection sections 114 and that may be electrically connected to the first interconnection sections 114 by contact plugs.

In one or more embodiments, the semiconductor devices 1000 include gate structures that may extend in the shape of parallel stripes. The gate structures may extend along the second lateral direction x2 perpendicular to the first lateral direction x1. The gate structures may also extend along another lateral direction that differs from the second lateral direction x2. In one or more embodiments, the gate structures are trench gate structures including a gate electrode in a trench that is electrically insulated from a surrounding part of the wide-bandgap semiconductor body by a gate dielectric. In some other embodiments, the gate structures are planar gate structures including a planar gate electrode arranged on a surface of the semiconductor body and being electrically insulated from a surrounding part of the wide-bandgap semiconductor body by a gate dielectric. In one or more embodiments, a gate electrode material of the gate structures is one of or a combination of doped polycrystalline silicon and metal silicide.

The semiconductor devices 1000 are based on a semiconductor body of a wide-bandgap semiconductor material with a band-gap of 2.0 eV or higher. The wide-bandgap semiconductor material may have a hexagonal crystal lattice and may be silicon carbide (SiC) or gallium nitride (GaN), by way of example. For example, the semiconductor material is 2H-SiC (SiC of the 2H polytype), 6H-SIC or 15R-SiC. According to another embodiment the semiconductor material is silicon carbide of the 4H polytype (4H-SiC). Other wide-bandgap semiconductor materials than SiC and GaN may alternatively be used for realizing semiconductor devices requiring operation at large current densities.

In one or more embodiments, each of the first and second gate fingers 104, 110, the first and second gate line portions 106, 108, the first bond area sections 112 and the first interconnection sections 114 are portions of one and the same patterned metallization structure.

In some embodiments, for example the embodiments illustrated in FIGS. 1A, 1B, the semiconductor devices 1000 further comprise a source line 116, wherein the first gate line portion 106 is arranged between the source line 116 and a transistor cell area 118, and second gate line portion 108 is arranged between the source line 116 and the transistor cell area 118. Similar to the first and second gate line portions 106, 108, the first bond area sections 112 and the first interconnection sections 114, also the source line 116 may be a part of one and the same patterned metallization structure. The source line 116 may be beneficial with respect to electrically connecting an edge termination structure in the semiconductor body in an area outside of and fully or partly surrounding the transistor cell area 118, for example.

Figure 2:
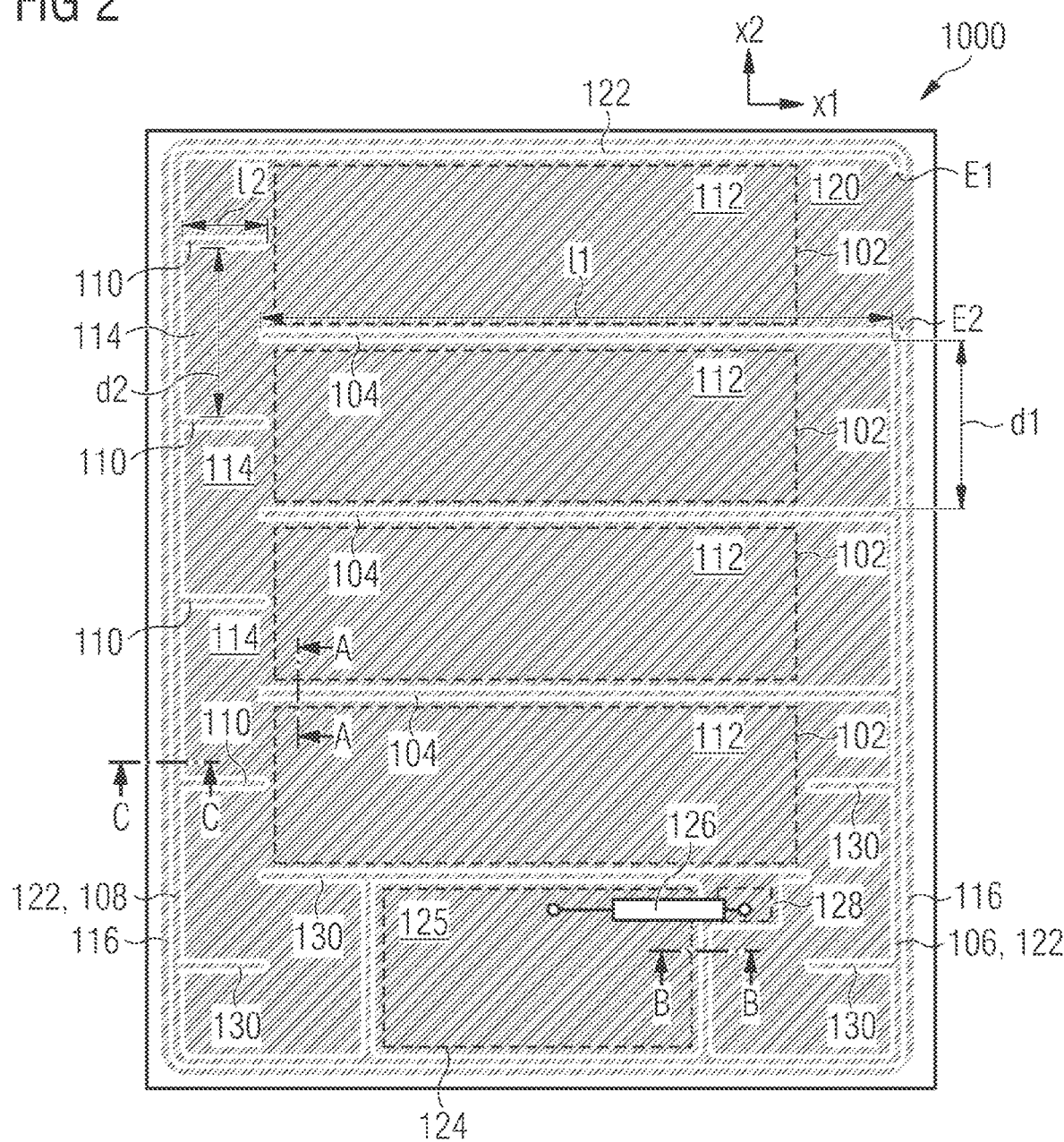

Referring to the schematic plan view of FIG. 2, the source line 116 and the first bond areas 102 are electrically connected by a second interconnection 120 extending through a gap between opposite ends E1, E2 of a gate line 122. The first gate line portion 106 and the second gate line portion 108 are integral parts of a gate line 122 that at least partly surrounds the transistor cell area, the gate line 122 being electrically coupled to a second bond area 124 including a second bond area section 125. The second bond area 124 may be a gate bond area, for example.

In one or more embodiments, for example in the embodiment illustrated in FIG. 2, a gate resistor 126 is electrically coupled between the gate line 122 and the second bond area 124. In some embodiments, a resistance of the gate resistor 126 ranges from $2\Omega$ to $30\Omega$. The resistance of the gate resistor 126 may allow for setting a gate signal delay, for example. The gate line 122 and the gate resistor 126 may be electrically connected through a measurement area 128. The measurement area 128 may be have a structure similar to the first and second bond areas 102, 124 and may differ from the first and second bond areas 102, 124 with respect to size. By way of example, a size of the measurement area 128 may be too small for wire bonding but large enough for being contacted by a contact needle of a test assembly.

In addition to the first and second gate fingers 104, 110, the semiconductor device 1000 further includes third gate fingers 130 for electrically connecting gate electrodes of transistor cells in corner areas of the active transistor cell area. These corner areas are outside of the regular contact pattern formed by the first and second gate fingers 104, 110 due to the arrangement of the second bond area 124, for example.

FIG. 3 illustrates an exemplary cross-sectional view along line A-A of FIG. 2 being an extension direction of the gate structures. The exemplary cross-sectional view illustrates a trench gate structure including a gate electrode 132 and a gate dielectric 134 in a trench that extends along the second lateral direction x2. A $p^+$-doped shielding structure 136 adjoins the gate dielectric 134 at a bottom side of the trench structure. The shielding structure 136 may allow for achieving a desired reliability of the semiconductor device 1000 under blocking conditions by limiting an electric field strength in the gate dielectric 134, for example at a trench corner. The semiconductor device 1000 may be a vertical FET including an $n^-$-doped drift zone 138. The $n^-$-doped drift zone 138 may be electrically coupled to a second load terminal L2 at a second side of the semiconductor body.

The gate electrode 132 of the gate structures is electrically connected to the first gate finger 104 at an intersection of the gate structure and the first gate finger 104. An insulating structure 140 provides an electric insulation between the first gate finger 104 and the first bond area section 112 as well as between the first bond area section 112 and the semiconductor body, for example. The insulating structure 140 may include one or a plurality of insulating materials, for example oxide(s) and/or nitride(s). A passivation structure 142 is arranged on the insulating structure 140 and on the first bond area section 112. The passivation structure 142 may include one or a plurality of passivation materials, for example imide(s), nitride(s) and oxide(s). Openings in the passivation structure 142 expose the first bond area section 112 for providing a chip contact, for example by wire bonding, and define the first bond areas 102.

Figure 5:
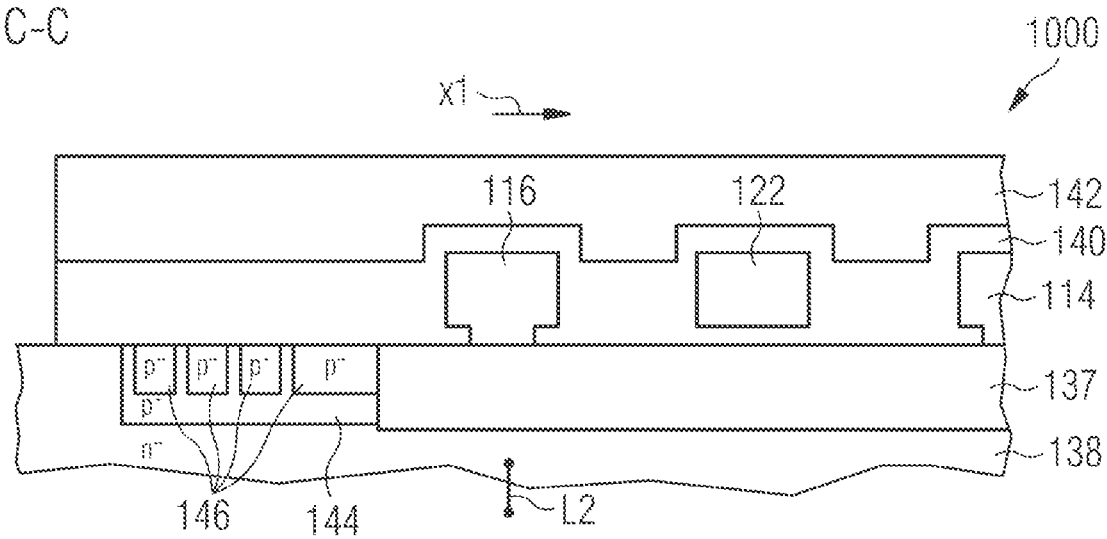
FIG. 5 is one example of a schematic cross-sectional view along line C-C of FIG. 2 illustrating an edge termination structure electrically connected to a source line.

An exemplary cross-sectional view along line B-B at the second bond area 124 of FIG. 2 is illustrated in FIG. 4. The gate resistor 126 may be formed by doped semiconductor material, for example by doped polycrystalline silicon. A p-doped body structure 137 is electrically connected to the source line 116 and to the first interconnection section 114. The p-doped body structure 137 may include the $p^+$-doped shielding structure 136 illustrated in FIG. 3. An exemplary cross-sectional view along line C-C at the edge of the semiconductor body of FIG. 2 is illustrated in FIG. 5. The semiconductor device 1000 further comprises an edge termination structure 143 in the semiconductor body. The edge termination structure 143 at least partly surrounds the transistor cell area, for example similar to the gate line illustrated in FIG. 2, and is electrically connected to the source line 116 via the p-doped body structure 137.

In one or more embodiments, for example in the embodiment illustrated in FIG. 5, the edge termination structure 143 is a junction termination extension (JTE) structure. The JTE structure includes a plurality of p-doped semiconductor regions 146 that are laterally spaced apart from one another. The plurality of p-doped semiconductor regions 146 are arranged in and are surrounded by a $p^-$-doped semiconductor well region 144. A maximum doping concentration of the p-doped semiconductor regions 146 is larger than a maximum doping concentration of the $p^-$-doped semiconductor well region 144.

In one or more embodiments, for example the embodiments illustrated in FIGS. 1A to 5, the semiconductor device 1000 is a power semiconductor field effect transistor (Power FET) or a power insulated gate bipolar transistor (Power IGBT) configured to conduct currents in a range from 1 A to 60 A for each of the first bond areas 102. In some embodiments, the semiconductor device is configured to operate at current densities ranging from 2 A/mm² to 20 A/mm², for example. Thus, by summing up a number of the first bond areas 102, a maximum current rating may be determined and specified in a data sheet of the semiconductor device 1000. In one or more embodiments, for example the embodiments illustrated in FIGS. 1A to 5, the semiconductor device 1000 is a vertical semiconductor transistor comprising a first load terminal and a control terminal at a first side of the semiconductor body and a second load terminal at a second side of the semiconductor body.

Figure 6:
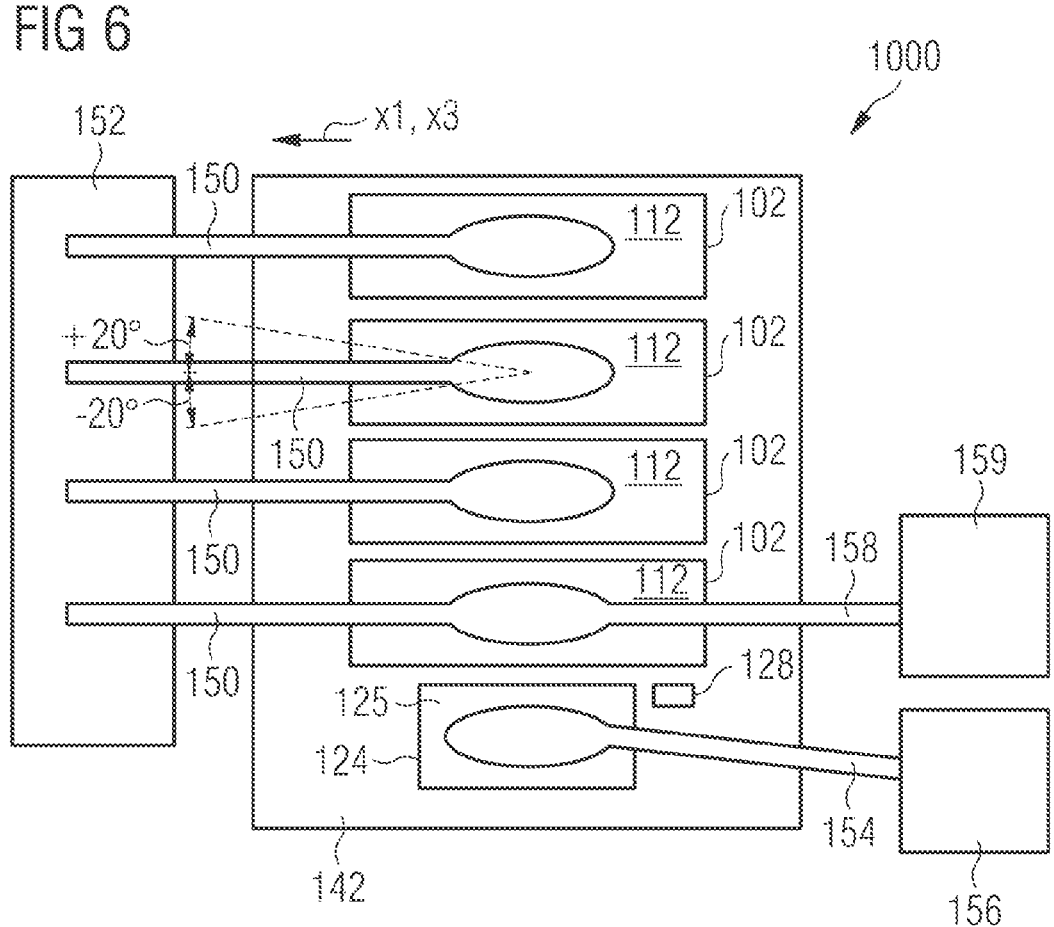
FIG. 6 is one example of a schematic plan view for illustrating a bond wiring pattern.

In the schematic plan view of FIG. 6, the semiconductor device 1000 may further include first bond wires 150, wherein one end of each of the first bond wires 150 is attached to a corresponding one of the first bond areas 102. The first bond wires 150 extend along a third lateral direction x3 that is aligned to the first lateral direction x1 with an angular deviation up to +/−20°. Details described with respect to the first bond areas 102 above apply accordingly. In the exemplary view of FIG. 6, the first lateral direction x1 coincides with the third lateral direction x3. However, the extension direction of the first bond wires 150 may fall within the angular range of +/−20° illustrated in FIG. 6 by a dashed line. The first bond wires 150 may be further attached to a first load conductor rail 152 of a lead frame, for example.

A second bond wire 154 is attached to the second bond area 124 and is further attached to a gate contact area 156 of the lead frame. A third bond wire 158 is attached to one of the first bond areas 102 and is further attached to an auxiliary contact area 159.

In one or more embodiments, a semiconductor module comprises the semiconductor device 1000 described with reference to any of the above embodiments. The semiconductor module may include a plurality of the semiconductor devices 1000 connected in parallel, for example. The semiconductor module may include further semiconductor devices other than the semiconductor device 1000.

In one or more embodiments, the semiconductor module is a power semiconductor module configured to conduct currents ranging from 50 A to 2000 A.

The schematic plan view of FIG. 7 illustrates a portion of a semiconductor module 2000 including at least three of the semiconductor devices 1000 connected in parallel. The first bond wires 150 of the three semiconductor devices 1000 are attached to the first load conductor rail 152. The second bond wires 154 of three semiconductor devices 1000 are attached to a gate conductor rail 1560. A second load terminal contact of the semiconductor device 100 may be attached via a second side of the semiconductor body, for example via a rear side of the semiconductor body to a second load conductor rail 160. The first load conductor rail 152 may be electrically connected to an external first load connector LC1 of the semiconductor module 2000. The second load conductor rail 160 may be electrically connected to an external second load connector LC2 of the semiconductor module 2000. The gate conductor rail 1560 may be electrically connected to an external gate load connector CC1 of the semiconductor module 2000.

The embodiments above allow for an increase of uniformity of a load current distribution across an active area of wide-bandgap semiconductor devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a semiconductor body of a wide-bandgap semiconductor material;
a plurality of first bond areas connected to a first load terminal of the semiconductor device;
first gate fingers arranged between the first bond areas, the first gate fingers extending in a first lateral direction and branching off from at least one of a first gate line portion and a second gate line portion; and
second gate fingers extending in the first lateral direction;
wherein a first length of the first gate fingers along the first lateral direction is greater than a second length of the second gate fingers along the first lateral direction,
wherein a sum of the first length and the second length is equal to or greater than a lateral distance between the first gate line portion and the second gate line portion along the first lateral direction.

2. The semiconductor device of claim 1, further comprising gate structures extending along a second lateral direction.

3. The semiconductor device of claim 1, wherein a first lateral distance between the first gate fingers corresponds to a second lateral distance between the second gate fingers.

4. The semiconductor device of claim 1, wherein the first length is larger than a first lateral distance between the first gate fingers, and wherein the second length is smaller than a second lateral distance between the second gate fingers.

5. The semiconductor device of claim 1, wherein the first length is between 0.2 mm and 10 mm, and wherein a first lateral distance between the first gate fingers is between 0.1 mm and 1.5 mm.

6. The semiconductor device of claim 1, wherein the second length is smaller than 60% of a second lateral distance between the second gate fingers.

7. The semiconductor device of claim 1, wherein the first bond areas include bond area sections of a continuous metallization area, and wherein the bond area sections are merged by first interconnection sections of the continuous metallization area.

8. The semiconductor device of claim 7, wherein each of the first and second gate fingers, the first and second gate line portions, and the bond sections includes a corresponding portion of one and the same patterned metallization structure.

9. The semiconductor device of claim 1, wherein the wide-bandgap semiconductor material is SiC.

10. The semiconductor device of claim 1, wherein gate electrodes of the gate structures are electrically connected to the first and second gate fingers at intersections of the gate structures and the first or second gate fingers.

11. The semiconductor device of claim 1, further comprising first bond wires, wherein one end of each of the first bond wires is attached to a corresponding one of the first bond areas, the first bond wires extending along a third lateral direction that is aligned to the first lateral direction with an angular deviation of up to +/−20°.

12. The semiconductor device of claim 1, wherein the first gate line portion and the second gate line portion are portions of a continuous gate line that at least partly surrounds a transistor cell area including the gate structures, the continuous gate line being electrically coupled to a second bond area.

13. The semiconductor device of claim 12, further comprising a gate resistor electrically coupled between the gate line and the second bond area.

14. The semiconductor device of claim 13, wherein a resistance of the gate resistor ranges from 2Ω to 30Ω.

15. The semiconductor device of claim 12, further comprising a source line at least partly surrounding the transistor cell area, wherein the gate line is arranged between the transistor cell area and the source line.

16. The semiconductor device of claim 15, wherein the source line and the first bond areas are electrically connected by an interconnection that extends through a gap between opposite ends of the gate line.

17. The semiconductor device of claim 15, further comprising an edge termination structure in the semiconductor body, wherein the edge termination structure at least partly surrounds the transistor cell area and is electrically connected to the source line.

18. The semiconductor device of claim 17, wherein the edge termination structure is a junction termination extension (JTE) structure.

19. The semiconductor device of claim 18, wherein the JTE structure includes a plurality of semiconductor regions of a first conductivity type that are laterally spaced apart from one another, wherein the plurality of semiconductor regions are arranged in and are surrounded by a semiconductor well region of the first conductivity type, wherein a maximum doping concentration of the plurality of semiconductor regions is larger than a maximum doping concentration of the semiconductor well region, and wherein the semiconductor well region adjoins a drift zone of a second conductivity type.

20. The semiconductor device of claim 1, wherein a gate electrode material of the gate structures is one of or a combination of doped polycrystalline silicon and metal silicide.

21. The semiconductor device of claim 1, wherein the semiconductor device is a power semiconductor field effect transistor configured to conduct currents in a range from 1 A to 60 A for each of the first bond area.

22. The semiconductor device of claim 1, wherein the semiconductor device is a vertical semiconductor transistor comprising a first load terminal and a control terminal at a first side of the semiconductor body and a second load terminal at a second side of the semiconductor body.

23. A semiconductor module comprising the semiconductor device of claim 1.

24. The semiconductor module of claim 23, further comprising a parallel connection of a plurality of semiconductor devices of the kind recited in claim 1.

25. The semiconductor module of claim 23, wherein the semiconductor module is a power semiconductor module configured to conduct currents ranging from 50 A to 2000 A.

26. A semiconductor device, comprising:
a semiconductor body of a wide-bandgap semiconductor material;
a multi-cell transistor formed in the semiconductor body, the transistor comprising a gate structure, a first load terminal, and a second load terminal, the gate structure being configured to control a conductive connection between the first and second load terminals;
wherein the gate structure comprises a first gate line portion, a second gate line portion, a plurality of first gate fingers, and a plurality of second gate line fingers,
wherein the first gate line portion and the second gate line portion are parallel to one another and spaced apart from one another,
wherein the first gate fingers are connected to the first gate line portion and extend lengthwise towards the second gate line portion in a first lateral direction,
wherein the second gate fingers are connected to the second gate line portion and extend lengthwise towards the first gate line portion in the first lateral direction,
wherein the first gate line portion and the second gate line portion each extend lengthwise in a second lateral direction that is perpendicular to the first lateral direction,
wherein a first length of the first gate fingers along the first lateral direction is greater than a second length of the second gate fingers along the first lateral direction,
wherein a sum of the first length and the second length is equal to or greater than a lateral distance between the first gate line portion and the second gate line portion along the first lateral direction.

27. The semiconductor device of claim 26, further comprising:
a plurality of first bond areas formed in a first metallization layer on the semiconductor body,
wherein each of the first bond areas are electrically connected to the first load terminal,
wherein each of the first gate fingers are formed in the first metallization layer,
wherein the first gate fingers are arranged alternatingly between immediately adjacent ones of the first bond areas, and
wherein edge sides of the first gate fingers that extend in the first lateral direction are separated in the in the second lateral direction from edge sides of the first bond areas that extend in the first lateral direction.

28. The semiconductor device of claim 26, wherein each of the first gate and second fingers are electrically connected to a conductive gate electrode formed underneath the first metallization layer.

* * * * *

UNITED STATES PATENT AND TRADEMARK OFFICE
CERTIFICATE OF CORRECTION

| | | |
|---|---|---|
| PATENT NO. | : 11,245,007 B2 | |
| APPLICATION NO. | : 15/979218 | |
| DATED | : February 8, 2022 | |
| INVENTOR(S) | : Peters | |

It is certified that error appears in the above-identified patent and that said Letters Patent is hereby corrected as shown below:

In the Claims

Column 10, Line 46 Claim 27, change "in the in the" to -- in the --

Signed and Sealed this
Nineteenth Day of April, 2022

Katherine Kelly Vidal
*Director of the United States Patent and Trademark Office*